United States Patent
Elliot

(10) Patent No.: US 9,885,346 B2
(45) Date of Patent: Feb. 6, 2018

(54) MATRIX CONTROLLED SHAPE MEMORY ACTUATOR ARRAY

(71) Applicant: Gibson Elliot, Fremont, CA (US)

(72) Inventor: Gibson Elliot, Fremont, CA (US)

(73) Assignee: Think Surgical, Inc., Fremont, CA (US)

( * ) Notice: Subject to any disclaimer, the term of this patent is extended or adjusted under 35 U.S.C. 154(b) by 0 days.

(21) Appl. No.: 14/988,266

(22) Filed: Jan. 5, 2016

(65) Prior Publication Data
US 2017/0191470 A1 Jul. 6, 2017

(51) Int. Cl.
*F03G 7/06* (2006.01)
*G06F 17/50* (2006.01)

(52) U.S. Cl.
CPC ......... *F03G 7/065* (2013.01); *G06F 17/5009* (2013.01); *G06F 17/5068* (2013.01)

(58) Field of Classification Search
CPC .................................. F03G 7/06; F03G 7/065
USPC ..................................................... 60/527–529
See application file for complete search history.

(56) References Cited

U.S. PATENT DOCUMENTS

| | | | |
|---|---|---|---|
| 4,551,975 A * | 11/1985 | Yamamoto | B25J 9/1085 60/528 |
| 4,553,393 A * | 11/1985 | Ruoff | F03G 7/065 337/140 |
| 4,716,731 A | 1/1988 | Sakai et al. | |
| 6,133,547 A | 10/2000 | Maynard | |
| 6,408,289 B1 * | 6/2002 | Daum | A61F 2/586 706/44 |
| 6,447,478 B1 * | 9/2002 | Maynard | F03G 7/065 600/151 |
| 7,575,807 B1 | 8/2009 | Barvosa-Carter et al. | |
| 9,339,950 B2 | 5/2016 | Allen | |
| 2006/0261709 A1 * | 11/2006 | Kato | A61B 1/0051 310/367 |

(Continued)

FOREIGN PATENT DOCUMENTS

| | | |
|---|---|---|
| JP | 2002048053 | 2/2002 |
| KR | 100930313 B1 | 12/2009 |

OTHER PUBLICATIONS

International Search Report dated Apr. 17, 2017 for International Application No. PCT/US2016/068944 filed Dec. 28, 2016.

*Primary Examiner* — Laert Dounis
(74) *Attorney, Agent, or Firm* — Avery N. Goldstein; Blue Filament Law PLLC

(57) ABSTRACT

A shape memory actuator system is provided that includes a shape memory actuator having a body made of a shape memory material, with individual power conductors interfaced with a first portion of the body, and one or more individual ground conductors interfaced with a second portion of the body in physical contact with the first portion of the body. A power source provides power to the individual power conductors. A controller is provided for controlling a resistive heating current connection sufficient to impart shape memory to the body between the individual power conductors and the one or more individual ground conductors with the proviso that the ground conductors are physically separated from the individual power conductors. A novel shape memory article results. A method for controlling a shape memory actuator and forming a shape memory article are also provided.

13 Claims, 14 Drawing Sheets

(56) References Cited

U.S. PATENT DOCUMENTS

2007/0120444 A1* 5/2007 Kato ................... B81B 3/0021
                                                    310/330
2008/0227060 A1   9/2008 Esashi et al.
2010/0117663 A1   5/2010 Herrera et al.
2010/0192567 A1   8/2010 Butera

* cited by examiner

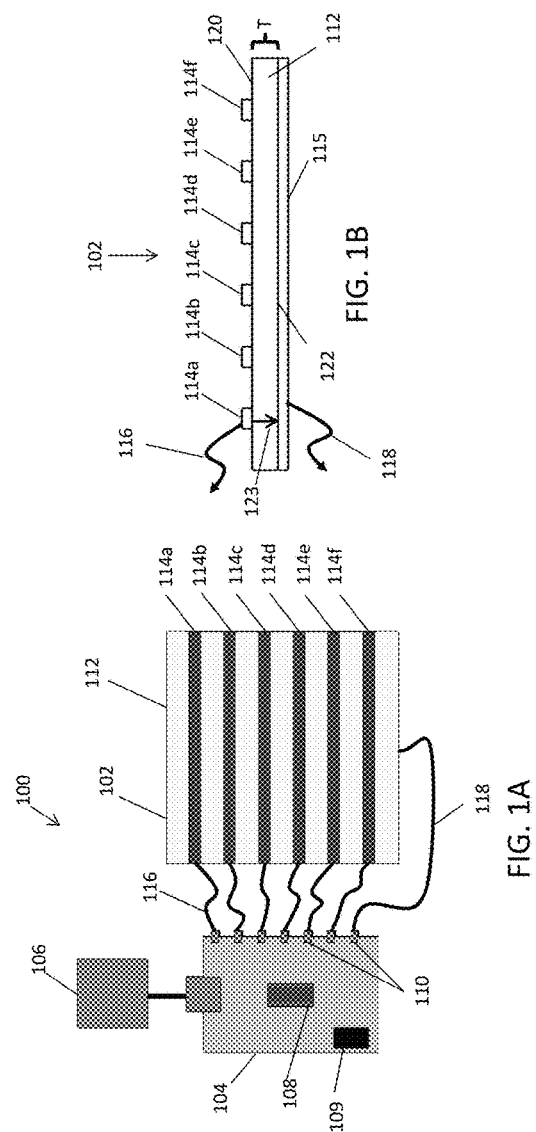

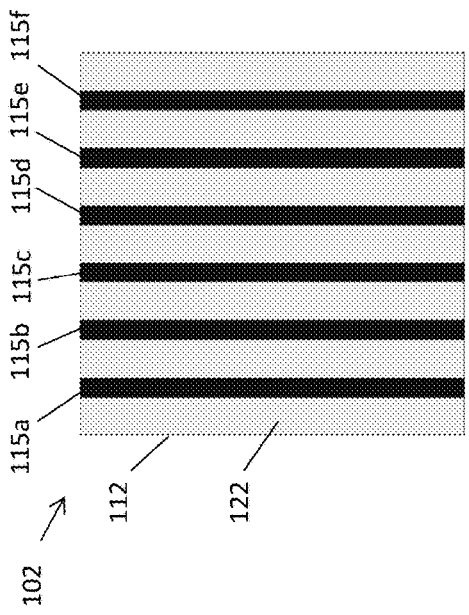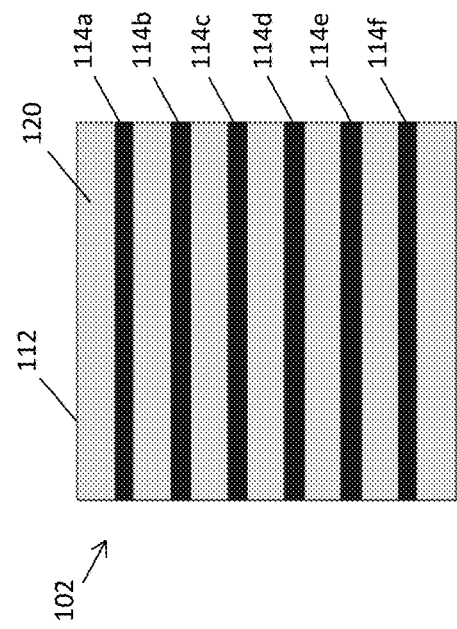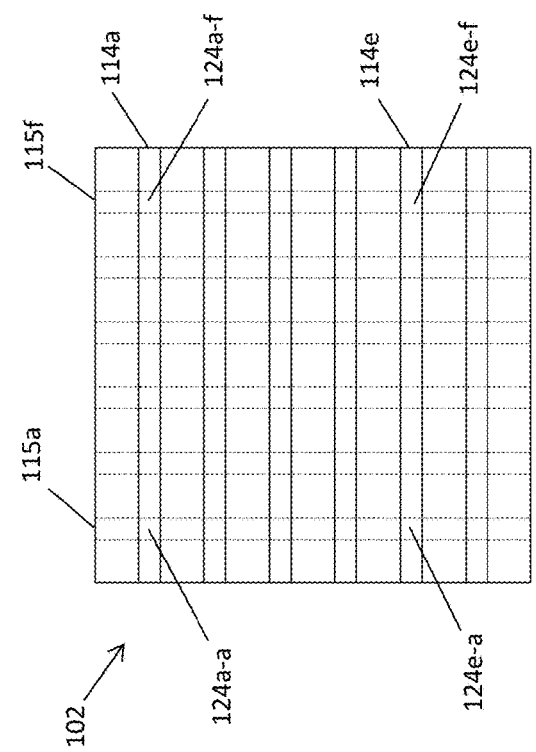

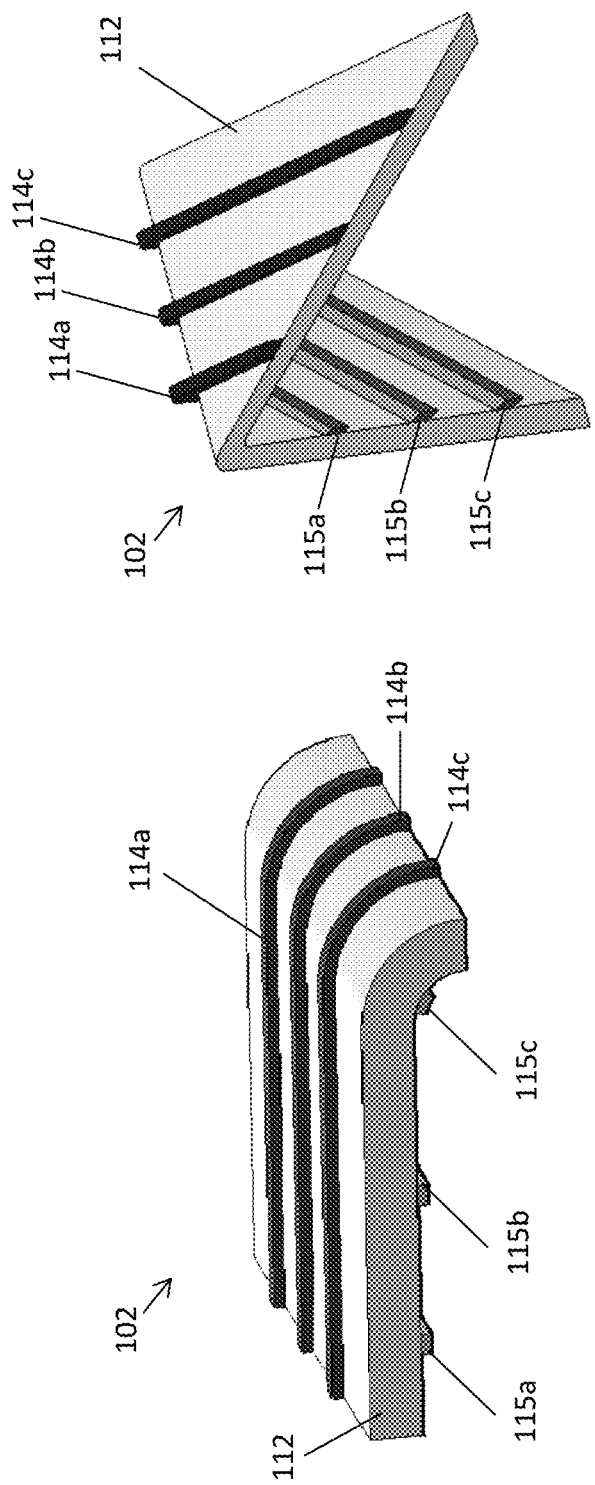

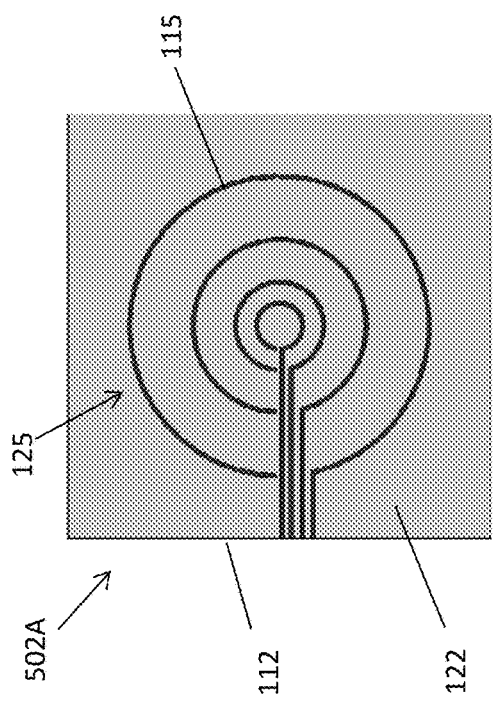
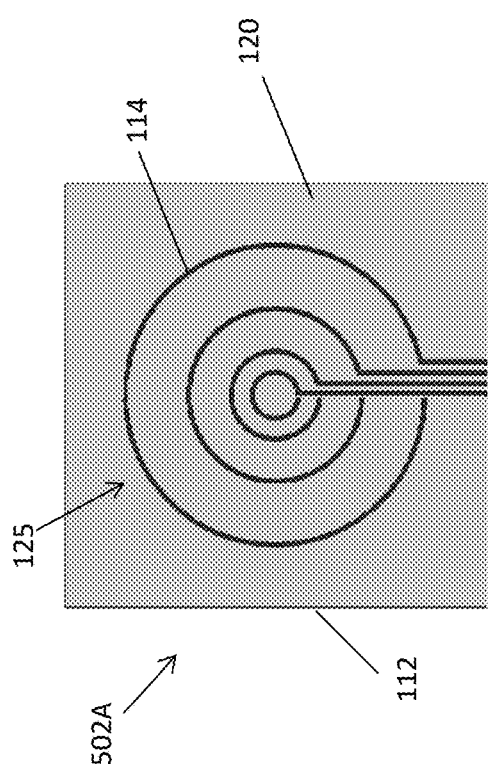
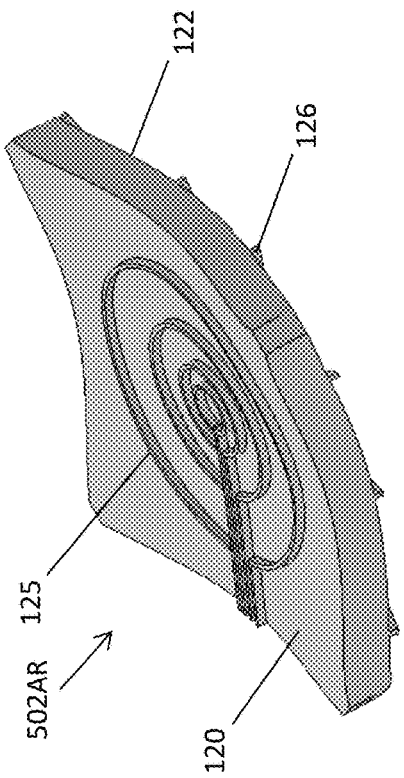
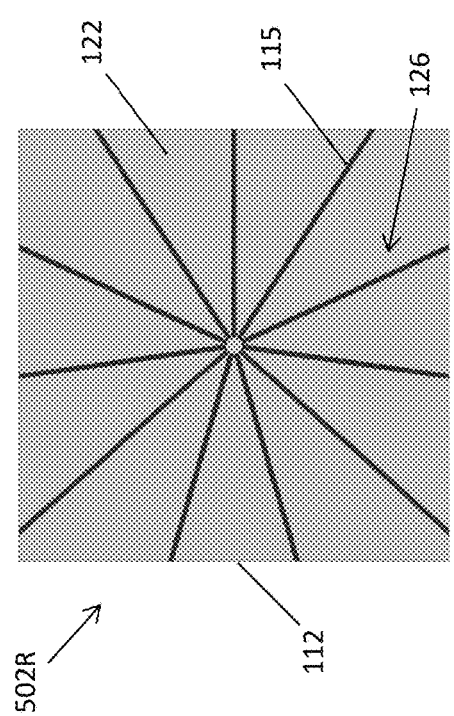

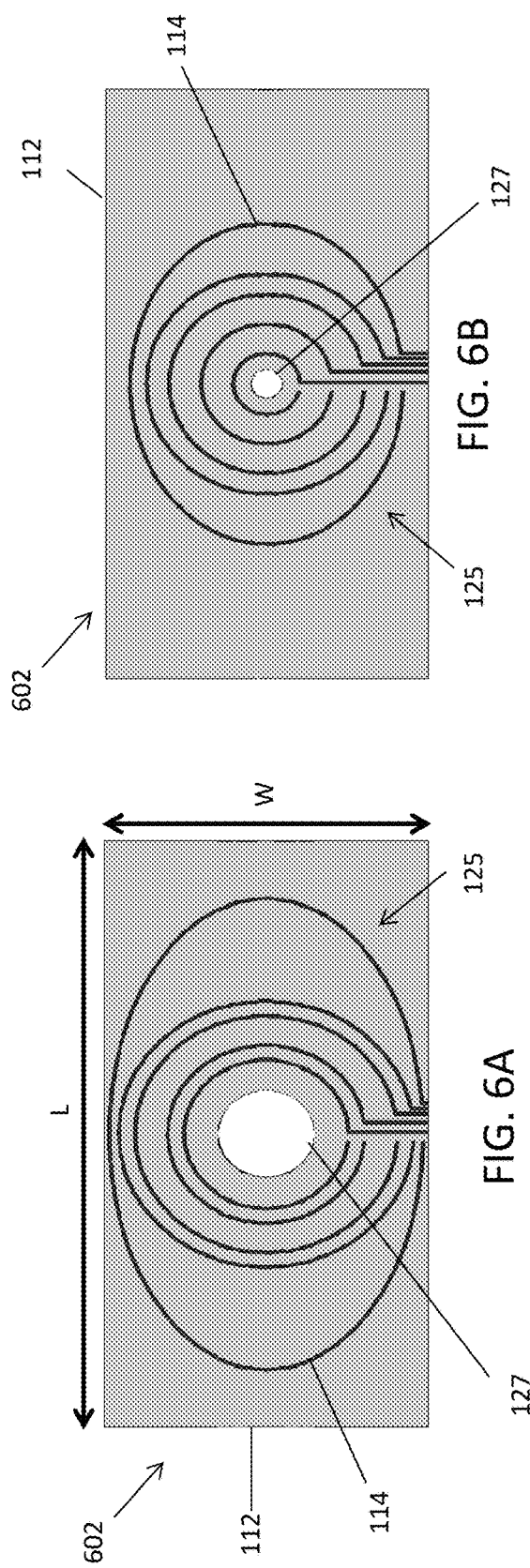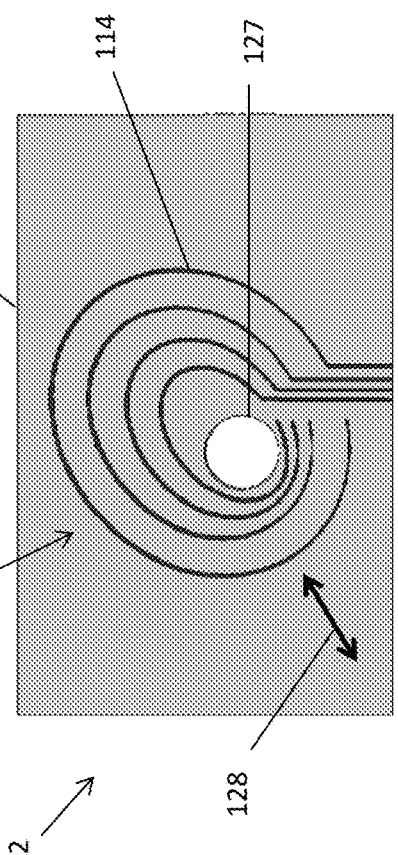

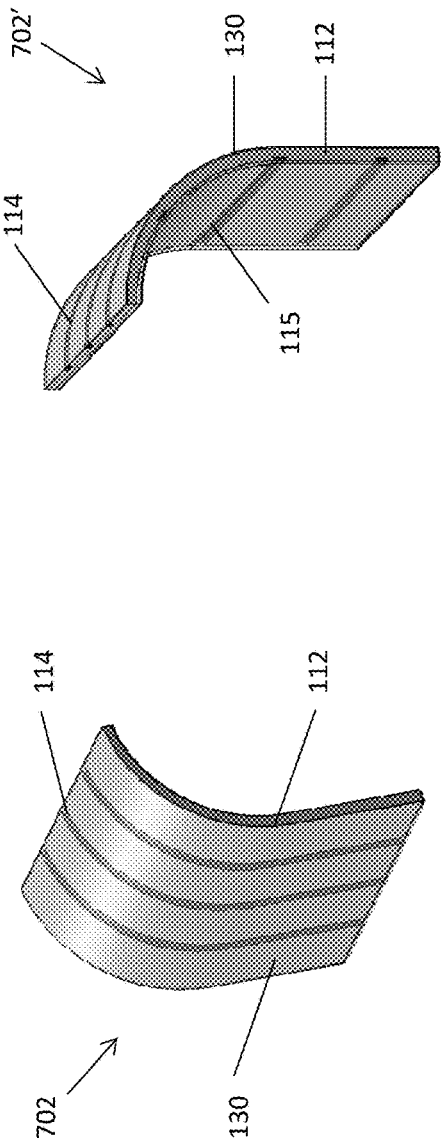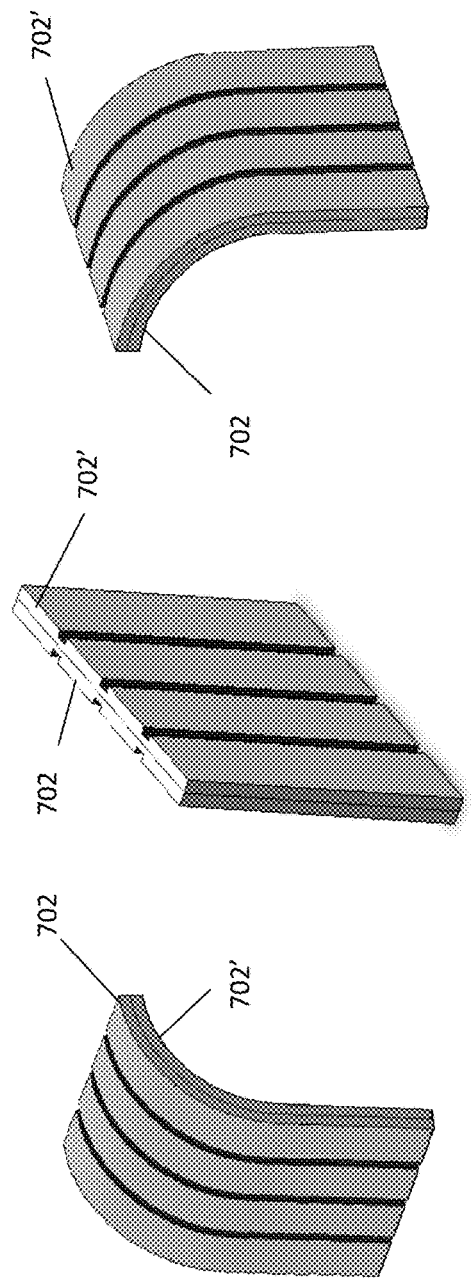

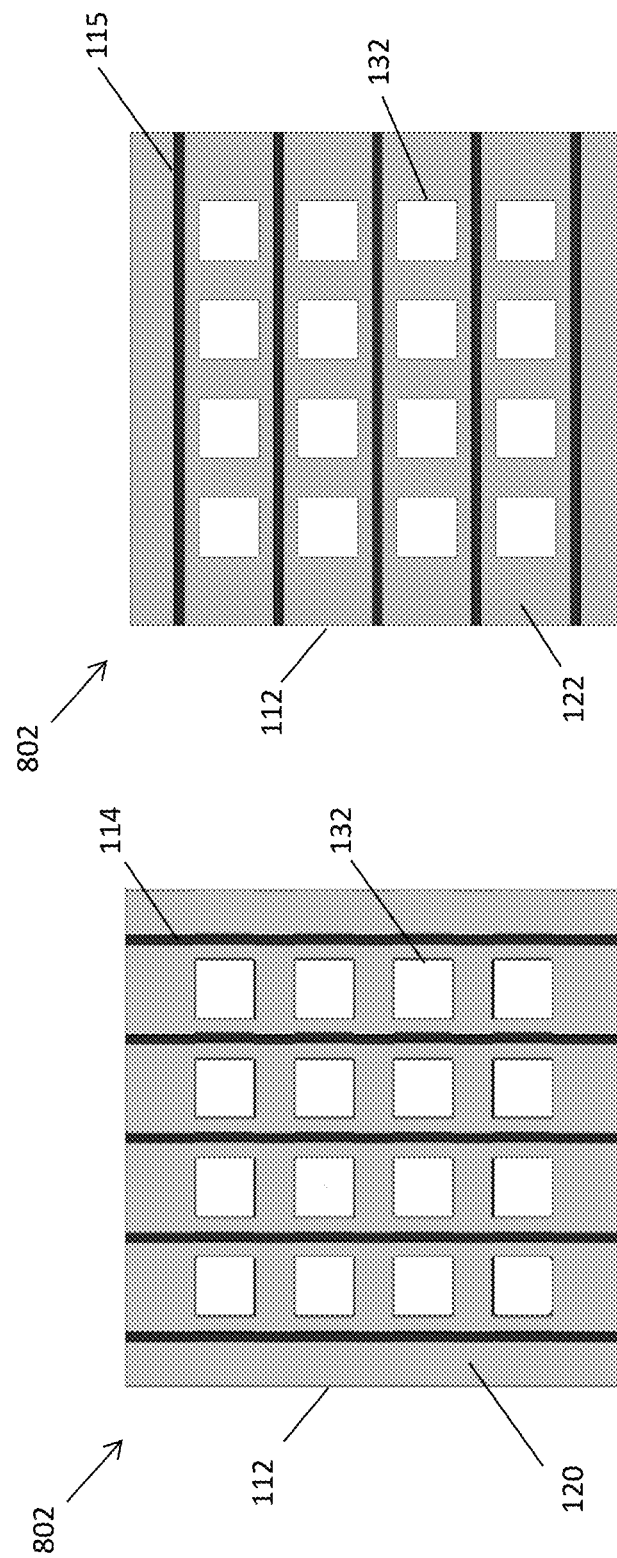

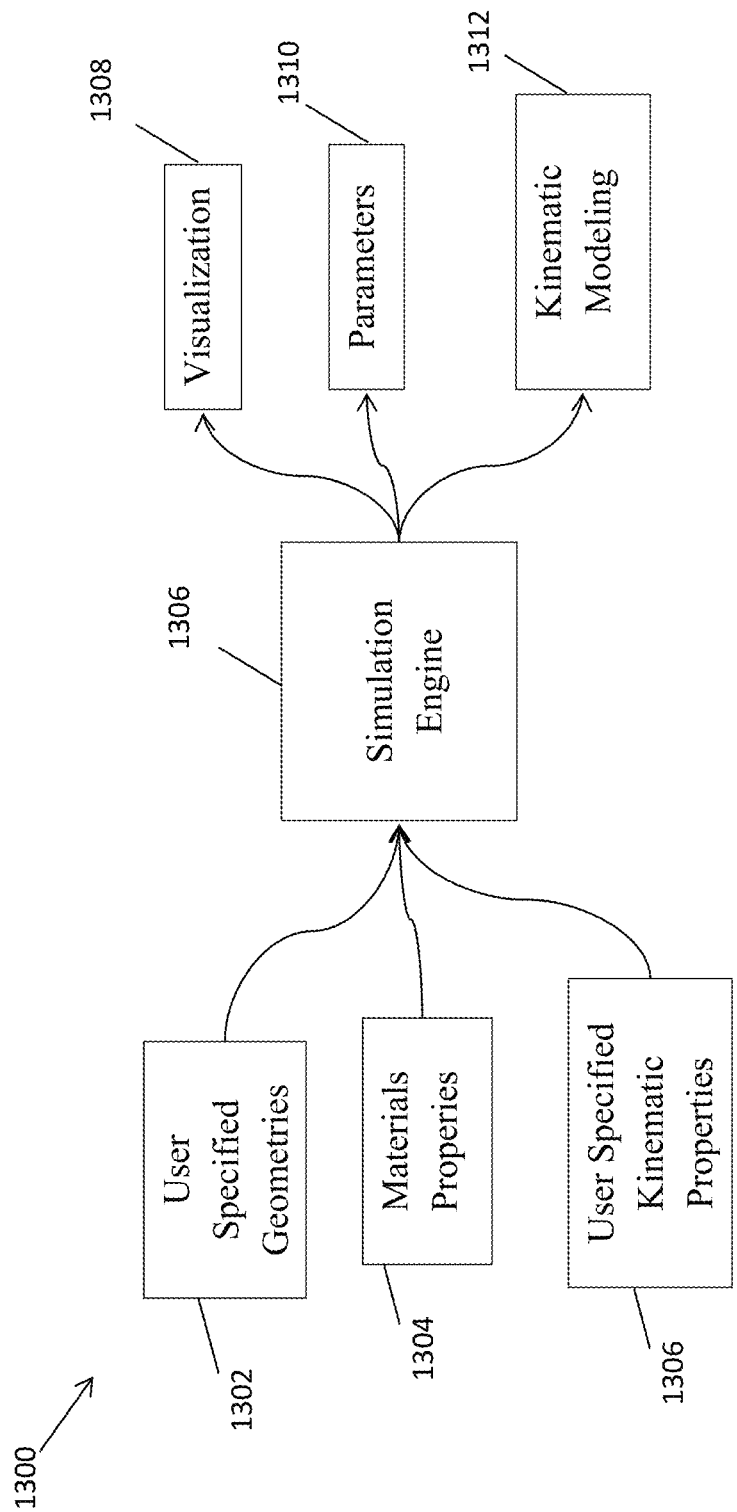

MATRIX CONTROLLED SHAPE MEMORY ACTUATOR ARRAY

TECHNICAL FIELD

The present invention generally relates to shape memory materials, and in particular to the control of shape memory materials using ohmic heating.

BACKGROUND

Nitinol and similar shape memory materials (SMM) have unique material properties, which allow them to be preformed in a desired "memorized" shape and return to that shape after any deformation above a material specific phase-change temperature. When a heat source is removed and the temperature drops below the phase-change temperature, the shape memory material retains a deformable state. The temperature range for controlling the shape can be varied based on the composition of the SMM and the techniques used to process and form the SMM. Due to the ability to control the shape of such a flexible, yet strong material has led to a variety of applicable uses for SMM.

However, the traditional methods for constructing and controlling a SMM, or actuators that are embedded with SMMs, has been limited for several reasons. SMMs are slow to reach the disparate temperatures required for transition without outside intervention, which typically requires cooling the material after being driven to the opposite phase to allow for transition. To obtain the required temperature range, the materials are generally constructed with individual shape memory elements in much the same way a traditional component such as a wire wound resistor might be, at its ends. However, these constructions lead to very limiting geometries and complex multipart mountings. Furthermore, the constant flexing of the SMM causes the mechanical connections between individual SMM elements to fatigue and rapidly fail overtime, which reduces the overall durability and longevity of these actuators, greatly increasing replacement and maintenance costs.

In addition, traditional methods to control multiple mechanical axis and multiple degrees of freedom of the actuators with SMMs have resorted to using individual conductors to heat each individual SMM element. The more SMM elements to drive the actuator, the more wiring that is required, which results in a larger size actuator, higher costs, reduced durability, and can lead to undesired thermal management design considerations. As such, the current actuators and designs have resulted in poor performance and their control has been limited to only one or two degrees of freedom. Having only one to two degrees of freedom of control greatly limits the use of SMM for a variety of applications.

Thus there is a need in the art for a controllable SMM that greatly reduces or eliminates the need for individual SMM elements. There is a further need to control an actuator or SMM in multiple axes and in multiple degrees of freedom to greatly expand their applicable uses.

SUMMARY OF THE INVENTION

A shape memory actuator system is provided that includes a shape memory actuator having a body made of a shape memory material, with a plurality of individual power conductors interfaced with a first portion of the body, and one or more individual ground conductors interfaced with a second portion of the body in physical contact with the first portion of the body. A power source provides power to the plurality of individual power conductors. A controller is provided for controlling a resistive heating current connection sufficient to impart shape memory to the body between the one or more of the plurality of individual power conductors and the one or more individual ground conductors with the proviso that the one or more individual ground conductors are physically separated from the plurality of individual power conductors.

A shape memory article is provided that includes a body made of shape memory material, with a plurality of individual power conductors interfaced with a first portion of the body, and one or more individual ground conductors interfaced with the second portion of the body. Regions of the body are preferentially heated to impart shape memory with the proviso that the one or more individual ground conductors are physically separated from the plurality of individual power conductors.

A method for controlling a shape memory actuator includes providing a shape memory actuator having a body made of a shape memory material, with a plurality of individual power conductors interfaced with a first portion of the body, and one or more individual ground conductors interfaced with the second portion of the body. A connection exists between one or more individual conductors of the plurality of individual power conductors and the one or more individual ground conductors. Power is provided through the connection to heat a portion of the body between the one or more individual conductors and the ground conductor to resistively heat the body to impart a shape memory thereto.

A method for fabricating a controllable shape memory actuator includes providing a shape memory material (SMM) with a first surface and second surface. The first surface and the second surface are coated with a conductive substance. A portion of the conductive substance is removed to create a set of individual conductors on the first surface or the second surface.

A method for designing a controllable shape memory actuator using a program running on a computer includes creating a desired shape memory material (SMM) body. At least one material property is defined for at least a portion of the body, where the material property includes at least one of a thermal permittivity, a thermal conductivity, an active cooling rate, or a passive cooling rate. At least one kinematic property for at least a portion of the body is also defined, where the kinematic property includes at least one of a pivot point, a linkage of two or more bodies; a conductor trace pattern, a conduction point, a rigid segment, or an air gap. The controllable shape memory actuator is then formed according to the program.

BRIEF DESCRIPTION OF THE DRAWINGS

The present invention is further detailed with respect to the following drawings that are intended to show certain aspects of the present of invention, but should not be construed as a limit on the practice of the invention, wherein:

FIG. 1A illustrates a shape memory actuator system in accordance with embodiments of the invention;

FIG. 1B illustrates a set of general components of a shape memory actuator and how the components are attached to the system in accordance with embodiments of the invention;

FIGS. 2A-2C illustrate a controllable shape memory actuator with a parallel array of a plurality of individual power conductors interfaced on a first surface (FIG. 2A), a parallel array of a plurality of individual ground conductors interfaced on a second surface (FIG. 2B), and a transparent view of the actuator showing a plurality of conduction points created by the intersection of the two parallel arrays (FIG. 2C) in accordance with embodiments of the invention;

FIGS. 3A and 3B depict examples of different configurations of the controllable shape memory actuator in accordance with embodiments of the invention;

FIGS. 5A-5D illustrate a controllable shape memory actuator with an annular array of a plurality of individual power conductors (FIG. 5A), a plurality of individual ground conductors (FIG. 5B), a radiating array of a plurality of individual ground conductors (FIG. 5C), and an example of a configuration of the shape memory actuator (FIG. 5D) in accordance with embodiments of the invention;

FIGS. 6A-6C illustrate different examples for controlling a feature incorporated with the controllable shape memory actuator, where the actuator is in a first expanded deformable state (FIG. 6A), an example of controllable contraction of the feature, (FIG. 6B), and an example of a controllable rotational range of motion of the feature (FIG. 6C) in accordance with embodiments of the invention;

FIGS. 7A-7E illustrate a first shape memory actuator with one configuration (FIG. 7A), a second shape memory actuator with a second configuration (FIG. 7B), and a controllable range of motion when the first shape memory actuator and second shape memory actuator are joined (FIGS. 7C-7E) in accordance with embodiments of the invention;

FIGS. 8A and 8B depict a front plan view (FIG. 8A) and a bottom plan view (FIG. 8B) of an example of a controllable shape memory actuator with a plurality of insulating holes between a plurality of conduction points in accordance with embodiments of the invention;

FIG. 13 is a schematic of an illustrative method for designing a controllable shape memory actuator in accordance with embodiments of the invention.

DETAILED DESCRIPTION

Figure 4A:
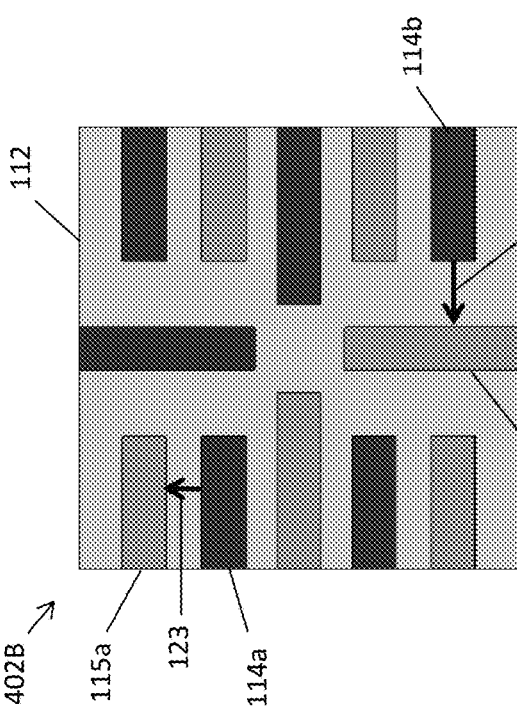
FIGS. 4A-4D depict examples of a controllable shape memory actuator having different array patterns of individual power conductors physically separated from individual ground conductors.

The present invention has utility as a system and method for the remote, semiautonomous, or autonomous actuation of a shape memory material (SMM) in multiple axes and multiple degrees of freedom on a micro or macro scale for a variety of applications. In particular, the system and method has utility in robotics and medical applications including the delivery of therapeutics, safely navigating arteries and veins, steering a surgical cutter, and aligning bony fractures. It should be appreciated that as embodiments of the invention are directed to robotic and medical applications, the system and methods may also be used in other fields such as mining, oil and gas exploration, buildings and structures, communications, and optics.

The following description of various embodiments of the invention is not intended to limit the invention to these specific embodiments, but rather enable any person skilled in the art to make and use this invention through exemplary aspects thereof.

It is to be understood that in instances where a range of values are provided that the range is intended to encompass not only the end point values of the range cut also intermediate values of the range as explicitly being including within the range and varying by the last significant figure of the range. By way of example, a recited range from 1 to 4 is intended to include 1-2, 1-3, 2-4, 3-4, and 1-4.

As used herein, a shape memory material (SMM) may be considered synonymous with shape memory alloys, smart metals, memory metals, memory alloys, or smart alloys. The general attribute of a SMM is the property of having two or more states; at least one "memorized" state, and a deformable state. The SMM is pre-treated to a desired "memorized" state and retains the "memorized" states when one or more phase change temperature(s) are reached. The phase change temperature(s) can vary greatly depending on the methods of manufacture and composition of the materials. Any material or alloy exhibiting this general property may be considered a SMM illustratively including, but not limited to, nickel-titanium (Nitinol), copper-aluminium-nickel, copper-zinc-aluminium-nickel, copper-zinc, iron-platinum, silver-cadmium, and equivalents thereof.

Also used herein are the terms "power conductors" and "ground conductors". In general, a conductor refers to an object or type of material that allows the flow of current. A power conductor refers to a conductor that directly receives power from a power source. A ground conductor refers to a conductor that receives power from the power conductor. However, it should be appreciated that the power conductor and ground conductor may be interchangeable, and are merely defined separately to aid in understanding embodiments of the invention. As specific types of conductors are referenced herein, typical conductors that may be used illustratively include graphene, copper, stainless steel, aluminum, other conductive metals and metal alloys, conductive coatings, and equivalents thereof.

Embodiments of the present invention generally describe a shape memory actuator, and a system and method for controlling the shape memory actuator. By controlling the temperature at specific regions on a SMM, only those specific regions are activated to their "memorized" state. Depending on the shape and design of the shape memory actuator(s), a plurality of configurations and movements can be controlled.

With reference to the figures, FIG. 1A illustrates a shape memory actuator system 100. The system 100 generally includes a shape memory actuator 102 generally includes a body 112 made of a shape memory material, a controller 104, and a power source 106. The controller 104 generally includes a microprocessor 108, memory (e.g., RAM, ROM) 109, and a series of ports 110 to electrically connect the controller 104 with a plurality of individual conductors 114a-f interfaced with the shape memory actuator 102. Other peripherals known in the art may also be in communication with the controller 104 such as a user-interface, user-input mechanisms (e.g., keyboard, mouse), additional memory storage, and data input mechanisms (e.g., compact disc (CD) reader, universal serial bus (USB) interface). In a particular embodiment, the controller 104 may be a computer containing specific software, data, and utilities to allow a user to manually control and/or develop software to control the shape memory actuator 102. An electrical ground connection 118 is provided to electrical communication between the controller 104 and the one or more conductors 114a-f so as complete a circuit across the body 112.

The controller 104 receives power from a power source 106. The power source 106 may be for example, one or more batteries, a connection to an electrical outlet, an electromagnetic power induction coil, other forms of wireless power transfer, one or more solar cells, a thermal power inductor, a microwave, and equivalents thereof. In a specific embodiment, the controller 104 and power source 106 is an individual unit with loaded software, data, utilities, or other executables to autonomously control the shape memory actuator 102 without user assistance.

With reference to FIG. 1B, in which like reference numerals have the meaning ascribe to that numeral with respect to the aforementioned figure, the shape memory actuator 102 generally includes a body 112 made of a shape memory material, a plurality of individual power conductors depicted as 114a-114f interfaced with the body 112 to define a first portion, and one or more individual ground conductors 115 interfaced with the body 112 to define a second portion of the body. The power conductors 114a-f and the one or more ground conductor(s) 115 are physically separated creating a gap of shape memory material therebetween. For example, as shown in FIG. 1B, the individual power conductors 114a-114f are interfaced on a first surface 120 of the body 112 (defining a first portion of the body 112) and the ground conductor 115 is interfaced with a second surface 122 of the body 112 (defining a second portion of the body 112). Therefore, the power conductors 114a-114f and ground conductor 115 are physically separated by the thickness T of the body 112. In certain inventive embodiments, the second portion of the body is in physical contact with the first portion of the body through a shared interface that is equivalent to at least 10 percent of a surface area defined by the first portion of the body.

The individual power conductors 114a-114f each have a power electrical connection 116 to a port 110 of the controller 112. Likewise, each of the ground conductor(s) 115 each has a ground electrical connection 118 to a port 110 of the controller 112. It is appreciated that two or more of the ground conductors 115 can share a single port 110 so as to act in concert. The controller 112 can therefore control the connections/disconnections between:

a. one or more of the individual power conductors; and
b. one or more of the ground conductor(s).

The controller may also control how (e.g., steady state, modulated) and/or the amount of current driven through the created connection(s), where the current follows the least path of resistance through the shape memory material between the connection(s). For example, the controller 112 may create a connection between individual power conductor 114a and the ground conductor 115. The current flows through the thickness T of the material between the connection (arrow 123) causing this area to heat; through a phenomenon known synonymously as ohmic heating or resistive heating. Once this area reaches the phase change temperature, the area conforms to the "memorized" state. The controller may modulate the current flowing through the power conductor 114a and ground conductor 115 to maintain the heat of the material at or near the phase-change temperature. Once the temperature drops below the phase change temperature, the actuator 102 may be deformed to a previous configuration using an external mechanism. External mechanisms operative herein illustratively include a spring, a compressive die, an elastic coupler, a pulley, a motor and gears, a piston, or a combination of any of the aforementioned. Using these general principles of the shape memory actuator system 100, various embodiments of the shape memory actuator 102 can be controlled, which are further described in detail below.

Parallel Array of Power and Ground Conductors

With reference to FIGS. 2A-2C, in which like reference numerals have the meaning ascribe to that numeral with respect to the aforementioned drawings, in a particular embodiment, the shape memory actuator 102 includes a parallel array of a plurality of individual power conductors 114a-114f on a first surface 120 of the body 112 (FIG. 2A) and a parallel array of a plurality of individual ground conductors 115a-115f on a second surface 122 of the body 112 (FIG. 2B). While the arrays 114a-114f and 115a-115f are depicted as orthogonal, is appreciated that the angle of intersection between an individual power conductor and an individual ground conductor can assume any angle to define a desired ohmic heating in a shape change material therebetween. The number of individual power conductors 114 and ground conductors 115 may vary depending on a user's preference and application as further described below. The orientation of the parallel array of power conductors 114a-114f is perpendicular with respect to the orientation of the parallel array of ground conductors 115a-115f. This is best shown in FIG. 2C, where the dotted lines represent the outline of the individual ground conductors 115a-115f on the second surface 122 of the body 112 and the solid lines represent the outline of the individual power conductors 114a-114f on the first surface 120 of the body 112. The power conductors 114a-114f and ground conductors 115a-115f are physically separated by the thickness of the body 112.

The perpendicularity of the power conductors 114a-114f with respect to the ground conductors 115a-115f creates an array of conduction volumes (124a-a thru 124e-f) as shown in FIG. 2C. Conduction volume(s) are also referred to herein as conduction point(s). The array of conduction points 124 provides specific regions where the heat of the SMM can be controlled. For instance, if the controller 104 creates a connection and provides current between power conductor 114a and ground conductor 115a, then current flows through conduction point 124a-a and heats only this region of the body 112. If the controller 104 creates a connection and provides current between power conductor 114e and ground conductor 115f, then current flows through conduction point 124e-f, likewise only heating this region. The controller 104 may therefore heat one or more specific regions at the conduction points 124 in the array across the body 112, resulting in a plurality of controllable configurations.

For example, with reference to FIG. 3A, in which like reference numerals have the meaning ascribe to that numeral with respect to the aforementioned drawings, if the controller 104 creates a connection and provides power between power conductors 114a, 114b and 114c, and ground conductor 115c, a bend may result in the actuator 102 (depending on the pre-treatment of the SMM) at this region due to the heating at conduction points 124a-c, 124b-c, and 124c-c. The controller 104 may create an additional connection with ground conductor 115b, causing the actuator 102 to bend even further.

In another example, with reference to FIG. 3B, in which like reference numerals have the meaning ascribe to that numeral with respect to the aforementioned drawing, the controller 104 may cycle through various connections, or cycle the current through the connections to create a bend across the diagonal of the actuator 102. If the controller 104 cycles through conductor's 114a-115a, 114b-115b and 114c-115c, the diagonal of the actuator 102 heats, causing the configuration as shown in FIG. 3B. As a result, through a programmed sequence of iterative heatings through controller 104 dynamically adjusting time, current flow, and sequence of specific conductors 114a-114f, a wide variety of material shapes can be imparted to a memory state for the material.

These examples assume the SMM was pre-processed with a "memorized" state having a bend across the body 112. Although, as further described below, the user may specify what "memorized" state is desired for a specific application.

Various Array Patterns

FIGS. 4A-4D in which like reference numerals have the meaning ascribe to that numeral with respect to the aforementioned drawings, illustrates various examples and possible combinations of different array patterns and orientations of the power conductors 114a-114d and ground conductors 115a and 115b interfaced with the body 112 of the shape memory actuators 402A, 402B, 402C, and 402D, respectively. In FIG. 4A, the plurality of individual power conductors may be aligned diagonally across the body 112. The spacing between the individual power conductors may vary. For example, in FIG. 4A, the spacing between power conductors 114a-114b is greater than the spacing between power conductors 114c-114d.

Figure 4B:
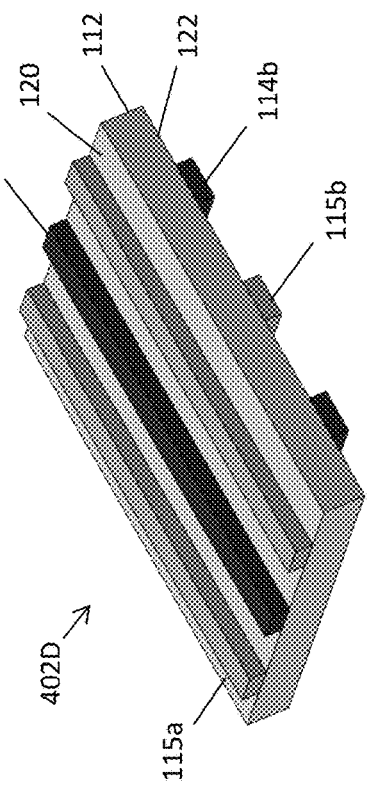

In FIG. 4B, the individual power conductors 114a and 114b (dark strips) and ground conductors 115a and 115b (lighter strips) may be on the same surface of the body 112, but still physically separated with a SMM there between. Therefore, current may flow (arrows 123) through and heat the material between power conductors and ground conductors.

Figure 4C:
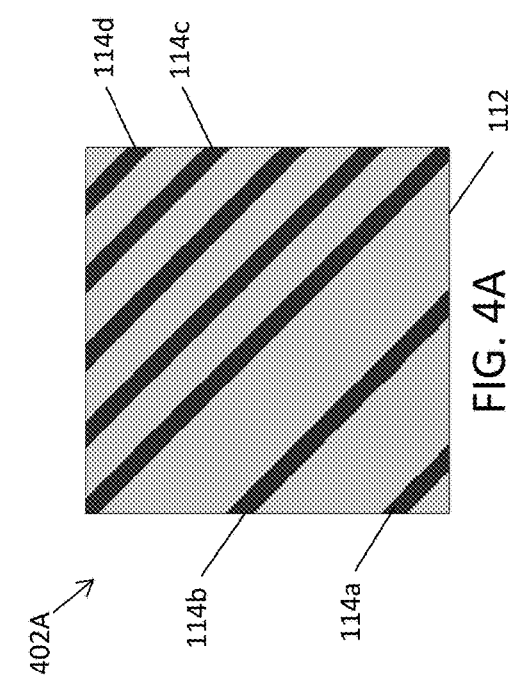

FIG. 4C illustrates another example of the plurality of power conductors 114a and 114b and ground conductors 115a and 115b interfaced on the same surface of the body 112 of the actuator 402C. The curved power conductors and ground conductors may cause current to flow (arrows 123) diagonally across the body 112 between conductors.

Figure 4D:
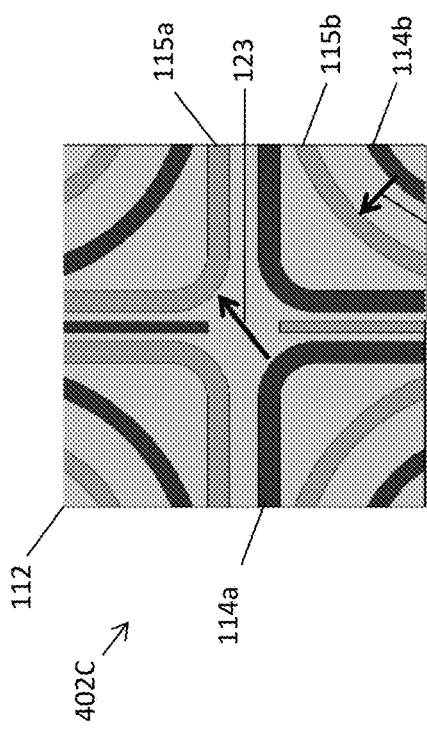

FIG. 4D illustrates that the power conductors 114a and 114b and ground conductors 115a and 115b may be interchangeable between a first surface 120 and second surface 122 of the body 112.

It is also appreciated that the power conductors 114 or ground conductors 115 may be routed through the body 112 to opposite surfaces if desired or necessary. In general, it should also be appreciated that numerous variations exist, each of which may be specified or designed by a user to provide different types/levels of control to obtain a vast number of different actuator configurations and actuation control (e.g., multiple degrees of freedom on multiple axes).

Annular and Radial Array of Conductors

In a specific embodiment, with respect to FIGS. 5A-5D, in which like reference numerals have the meaning ascribe to that numeral with respect to the aforementioned drawings, the shape memory actuator 102 includes an annular array 125 or radial array 126 of a plurality of individual conductors are interfaced with the body 112. For ease of illustration, multiple power conductors and ground conductors that are individually addressable by the controller 104 are hereafter collectively labelled as 114 and 115, respectively. FIG. 5A illustrates an annular array 125 of a plurality of individual power conductors 114 interfaced on a first surface 120 of the body 112. The annular array 125 forms a plurality of individual conductors forming concentric circles, arcs, or ellipses, of varying diameter. FIG. 5B illustrates an annular array 125 of a plurality of ground conductors 115 interfaced on a second surface 122 of the body. FIG. 5C illustrates a radial array 126 of a plurality of ground conductors 115 interfaced on the second surface 122 of the body 112. The radial array 126 forms a plurality of individual conductors 114/115 diverging from a central point on the body 112. It should be apparent that a plurality of conduction points are created through the material where the annular array 125 of individual conductors 114/115 interfaced on the first surface 120 of the body 112 intersect with the radial array 126 of individual conductors 114/115 interfaced on the second surface 122 of the body 112.

By controlling the connections and/or current between one or more of the power conductors 114 and ground conductors 115, the shape memory actuator (502A, 502R, 502AR) may be controlled in various advantageous configurations. For instance, the hemispherical configuration shown in FIG. 5D may be obtained with an annular array 125 of conductors interfaced on a first surface 120 and an annular array 125 or radial array 126 of conductors interfaced on a second surface 122.

In particular inventive embodiments, with respect to FIGS. 6A-6C, in which like reference numerals have the meaning ascribe to that numeral with respect to the aforementioned drawings, a feature 127 may be integrated with the body 112 within the annular array 125 of conductors 114/115, or within the annular array 125 of conductors interfaced on a first surface with a radial array 126 of conductors on a second surface. The feature 127 may be for example a hole, a peg, an axle, or an optical lens. As shown in FIG. 6A, the feature 127 is a hole. The body 112 may be stretched a length L and/or width W to under half of its working capability (the working capability being a function of the SMM) so as to preserve its "memorized" state functionality. The stretched body 112 provides the capability for contraction and expansion of the body 112. By heating specified regions using the techniques as described above, the feature 127 can be controlled.

For example, with reference to FIGS. 6A and 6B, the size of the hole feature 127 may be controlled by heating the regions between one or more individual power conductors 114 in the annular array 125 and one or more individual ground conductors 115 in the annular array 125 or radial array 126. If the sides of the body 112 are externally fixed, then the size of hole feature 127 in FIG. 6A may be reduced to the size of the hole in FIG. 6B by the contraction of the body 112. This may provide a mechanism for controlling the flow rate of a fluid through the hole 127.

In another example, with reference to FIG. 6C, in which like reference numerals have the meaning ascribe to that numeral with respect to the aforementioned drawings, specific portions of the body 112 may be contracted (arrow 128) to cause the position of the hole feature 127 to change (i.e., the hole is centered in FIG. 6A and moves down and to the left in FIG. 6C). With the sides of the body 112 externally fixed, the controller 104 may cyclically cause portions of the body to heat and contract in a radial manner, which causes the feature 127 to rotate and may provide a rotary mechanism for various applications.

External Mechanisms and Multiple Shape Memory Actuators

Once the activated/heated regions of the shape memory actuator 102 drop below the phase change temperature, the regions are now deformable and may require an external mechanism or other shape memory actuators to retain a previous configuration. In particular embodiments, the external mechanism may be one or more springs attached to portions of the body 112. For example, with reference to FIG. 3A, a spring may be attached to the location of the bend and adapted to deform the bend back to its original flat configuration.

In specific inventive embodiments, with reference to FIGS. 7A-7C, in which like reference numerals have the meaning ascribe to that numeral with respect to the aforementioned drawings, a first shape memory actuator 702 with a first controllable range of motion (e.g., a first radial bend), and a second shape memory actuator 702' with a second controllable range of motion (e.g., a second radial bend), may be joined together to control a full range of motion as shown in FIGS. 7C-7E. The conductors of the two or more actuators 702 may be controlled by a single controller 104 or multiple controllers.

In a particular inventive embodiment, multiple shape memory actuators 102 may be fabricated and joined to create a plurality of shape memory actuators 102 where each shape memory actuator 102 provides a single building block to form a larger and more complex shape memory actuating structure (e.g., joining the sides of two or more shape memory actuators 102). Each individual shape memory actuator 102 may have different conductor 114/115 patterns (e.g., combining shape memory actuators 102 with the different conductor 114/115 array patterns as shown in FIGS. 4A-4D). The multi shape memory actuator structure may be controlled by one or more controller(s) 104. The number of required controllers 104 may be a function of the number and/or density of individual conductors 114/115 interfaced with the bodies 112.

In specific inventive embodiments, a surface coating 130 may be applied upon each individual conductor 114/115, or over an entire surface of the shape memory actuator 102. The surface coating 130 may be used to reduce cross-talk or insulate the conductors 114/115 between two or more joined shape memory actuators 102, or to protect/interact with the external environment. For example, the surface coating 130 (as shown in FIGS. 7A and 7B) may be an inflammation agent to promote stem cell cytokine signaling and tissue growth at one or more sites where the shape memory actuator(s) are used. Surface coatings for reducing cross-talk, insulation and/or interacting with the external environment may include for example, a laminate, an insulator, a film, vapor deposited particles, epoxies, silicone, biological agents, lubricating agents, or therapeutic agents.

Insulators

In particular inventive embodiments, with reference to FIGS. 8A and 8B, the shape of memory actuator 802 may include insulators 132. The insulators 132 may be integrated with the body 112 to aid in thermal control between the different possible connections that can be created between individual power conductors 114 and individual ground conductors 115. For example, the insulators 132 may be several holes integrated within the body 112 and located between conduction points formed by the intersections of individual power conductors 114 on a first surface 120 of the body 112 and individual ground conductors 115 on a second surface 122 of the body 112.

The insulation 132 increases the specificity in controlling different regions on the body 112 and enhances the control and operation thereof. For instance, the chance of heat dissipating from one conduction point to another is minimized by the insulating holes.

Tubular Shape Memory Actuators

Figure 9B:
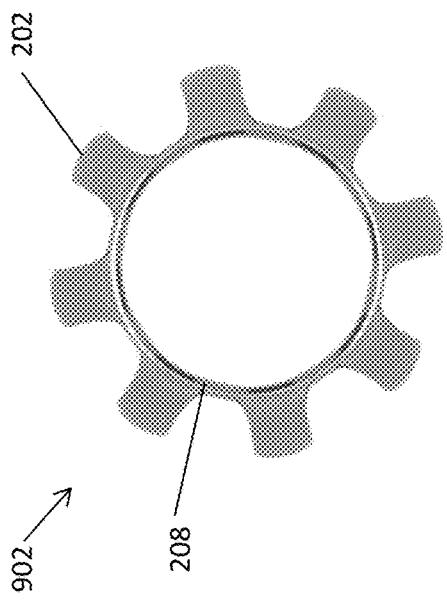
FIGS. 9A-9C illustrate a controllable tubular shape memory actuator having a plurality of individual actuators (FIG. 9A), a top plan view of the tubular shape memory actuator (FIG. 9B), and a plurality of individual conductors interfaced with the tubular shape memory actuator (FIG. 9C) in accordance with embodiments of the invention.
Figure 9D:
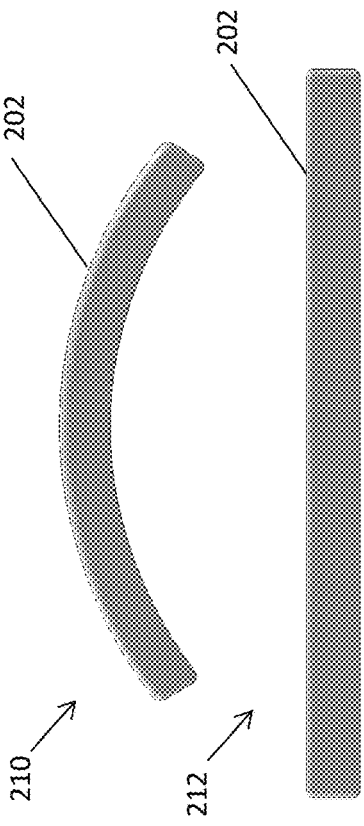
FIG. 9D illustrates an actuating motion of an individual actuator of the tubular shape memory actuator shown in FIGS. 9A-9C in accordance with embodiments of the invention.
Figure 9A:
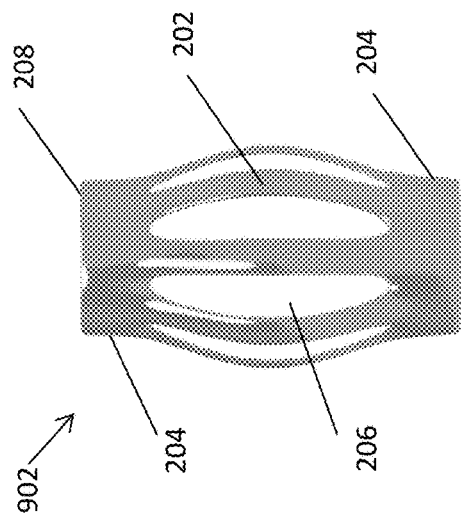
Figure 9C:
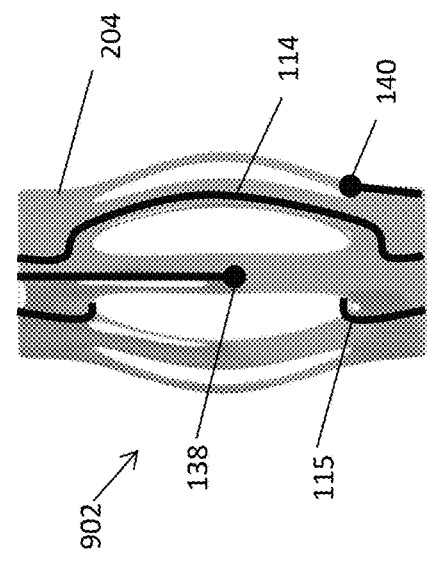

In specific inventive embodiments, with reference to FIG. 9A-9C, the shape memory actuator 902 is a tubular shape memory actuator. The tubular shape memory actuator 902 includes a plurality of individual actuators 202 radially spaced and integrally connected between two tubular bodies 204. The individual actuators being made of SMM. The individual actuators 202 and the tubular bodies 204 may be fabricated from a SMM monolithic structure, or they may be connected using welding techniques (e.g., ultrasonic welding), brazing, soldering, adhesives, fasteners (e.g., screws, clamps, or rivets) and equivalents thereof.

The individual actuators 202 may be separated by a void 206, which may be used as an insulator to minimize cross-talk, and/or may be used to provide each individual actuator 202 with enough space to actuate.

The tubular bodies 204 may be used for a variety of purposes. A controller 104 may be housed concentrically within one or more tubular bodies 204. The tubular bodies 204 may provide additional space or room for each of the individual conductors 114/115 before/after traversing the individual actuators 202. The tubular bodies 204 may also provide an attachment point for other shape memory actuators 102 or tubular shape memory actuators 902. For example, the ends 208 of the tubular bodies may have an interlocking mechanism for an end 208 of a second tubular shape memory actuator 902. Therefore, multiple tubular shape memory actuators 902 may be connected to form a multi-structured actuator, with each tubular shape memory actuator 902 being individually controlled, and/or controlled in unison by one or more controllers 104.

In particular inventive embodiments, with reference to FIG. 9C, the tubular shape memory actuator 902 includes a plurality of individual conductors 114/115 interfaced with the individual actuators 202 and/or tubular bodies 204. The conductors 114/115 are likewise physically separated by SMM to heat the SMM there between as described above. The voids 206 may advantageously provide one or more routes for conductors 114/115 to traverse to the opposite surfaces of the individual actuators 202 to improve the density of individual conductors 114/115. The conductors 114/115 may be interfaced with the individual actuators 202 so as to create conduction points at specific locations along the individual actuators 202. For example, a conduction point may be created at the center of the individual actuators 202, represented as point 138. Or, a conduction point may be created near the connection of the individual actuator 202 and tubular body 204, represented as point 140. It should be appreciated, that the conductors 114/115 may traverse the entire length of an individual actuator(s) 202, or multiple conductors 114/115 may be interfaced on an individual conductor 202 to form multiple conduction points thereon.

Depending on the pre-treatment of the individual actuators 202 to a "memorized" state, each individual actuator 202 can therefore be actuated using the same methodology as described above. In a specific embodiment, with reference to FIG. 9D, the individual actuator 202 may have a first deformable configuration 210, and upon heating the SMM, for example at conduction point 138, a new "memorized" configuration 212 may be obtained. This may cause the tubular shape memory actuator 902 to bend in a first degree of freedom along a first axis. By controlling another individual actuator 202, then the shape memory actuator 902 may bend in a second degree of freedom along a second axis, and so forth. It should be apparent that the shape memory actuator 902 may also expand/contract its overall length depending on the control of a combination of individual actuators 202.

In specific inventive embodiments, if two or more tubular shape memory actuators 902 are joined within the other, where the individual actuators 202 have counteracting "memorized" states, then a full range of motion may be controlled, similar in concept to FIGS. 7A-7C. It should also be appreciated that other external mechanisms may also cause the individual actuators 202 to return to a previous configuration after the SMM of the individual actuator 202 drops below a phase change temperature.

Figure 10A:
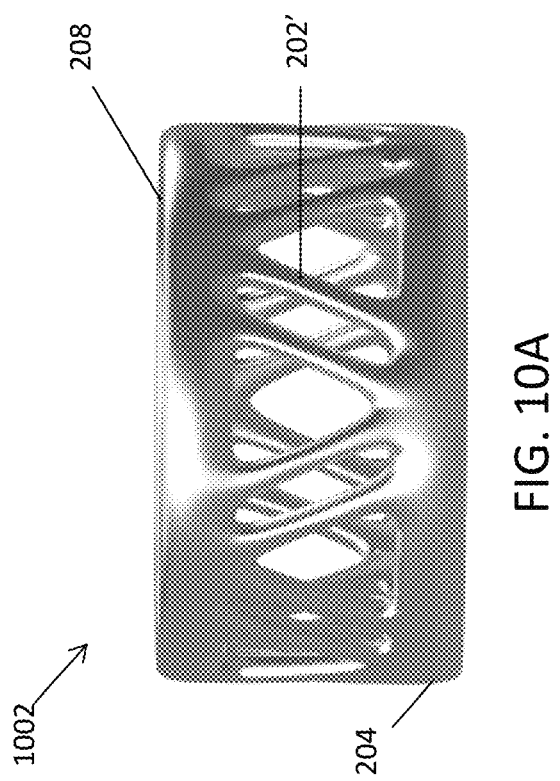
FIGS. 10A-10B illustrate a controllable tubular shape memory actuator with a plurality of non-uniformly distributed individual actuators (FIG. 10A), and a conduit of individual conductors interfaced with the tubular shape memory actuator (FIG. 10B) in accordance with embodiments of the invention.
Figure 10B:
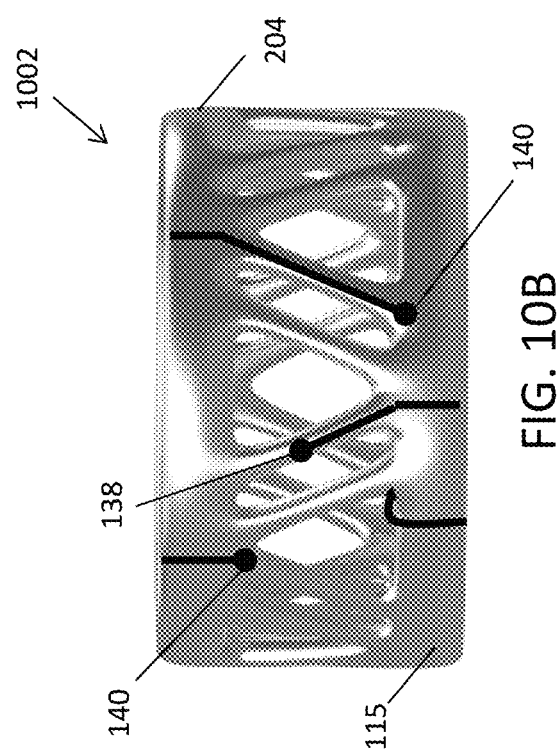

In a particular embodiment, with reference to FIGS. 10A-10B, another tubular shape memory actuator 1002 is shown. The tubular shape memory actuator 1002 includes individual actuators 202' non-uniformly distributed and integrally connected to the tubular bodies 204. The tubular shape memory actuator 1002 merely illustrates that multiple variations may exist in memory actuator construction, where different variations may provide different types of control and degrees of motion/axes that may be useful for different applications.

Overall, one or more tubular shape memory actuator(s) 902/1002 may be combined or connected to create a multi-tubular controllable structure that may be controlled in multiple degrees of freedom on multiple axes. A single controller 104 may control each of the individual tubular shape memory actuators 902/1002 of the multi-tubular structure. Each controller 104 may be housed within or integrated with each individual tubular shape memory actuator 902/1002 and control the power to each of the conductors 114/115. Each controller 104 may also provide kinematic feedback as to the position and orientation of each individual tubular shape memory actuators 902/1002 to the other controllers 104. Therefore, the position of the most distal part of the structure is known with respect to the position of the base, or most proximal portion, of the multi-tubular structure through kinematic transformations. In addition, not only would the most distal position be known, but the position and orientation of each individual tubular shape memory actuator 902/1002 would also be known at any given time. It should be appreciated, that a controller 104 may control two or more of the tubular shape memory actuators 902/1002 within a multi-tubular shape memory actuator and may depend on variables such as, conductor density, the scale of the structure, and the desired level of control. The applications of multi-tubular shape memory actuator is highly beneficial where one may want to control an object that may fit through or wrap around the tubular shape memory actuator(s). For example, a contracting/expanding and multiple degree of freedom steerable catheter may be controlled to continually bend at an arterial junction so the arterial wall is untouched. A surgeon may precisely guide through the complex networking of a patient's brain, accessing deep areas that have been otherwise inaccessible, without having to worry about puncturing the tissues. A surgical cutter may be precisely guided through a minimally invasive incision to cut a specific shape corresponding to a shape to receive an implant. On a larger scale, drills may be directed in multiple degrees of freedom for oil and gas exploration, where other sensors may be integrated with the controller 104 to aid in autonomously steering the drill towards a desired resource.

Solid Shape Memory Actuators

Figure 11:
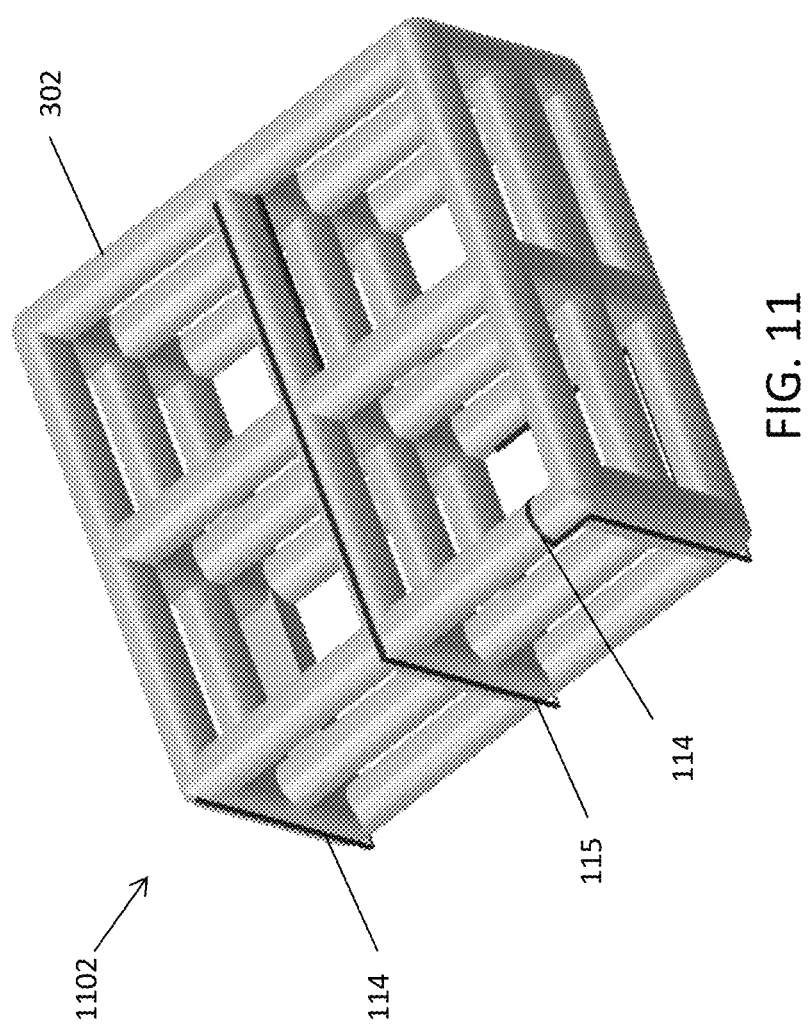
FIG. 11 illustrates a solid shape memory actuator with a plurality of structural beam actuators in accordance with embodiments of the invention.

In specific inventive embodiments, with reference to FIG. 11, a solid shape memory actuator 1102 is shown. The solid shape memory actuator 1102 includes a series of structural beam actuators 302 made of SMM. The structural beam actuators 302 may be fabricated or designed into any shape desired by a user. Conductors 114/115 interface with the structural beam actuators 302 to heat specific regions of the solid shape memory actuator 1102 using the methods as described above. The structural beam actuators 302 may be solid or hollow, where the conductors 114/115 may interface on the outer surface of the beam actuators 302, within the beam actuators 302 if they are hollow, or combinations thereof. Since each structural beam actuator 302, specific regions of each structural beam actuator 302, and/or multiple structural beam actuators 302 may be controlled to a "memorized" state, the entire shape and/or configuration of the solid shape memory actuator 300 can morph/change. This has many advantages in applications where the shape/configuration of an entire body may conform to a desired shape(s).

The solid shape memory actuator 1102 may be coated or surrounded with a mold, a polymer, a pliable material, or a malleable material. The solid shape memory actuator 1102 may also interact with other structures or materials to control their position, orientation, or surface topography. For example, a building structure may have multiple solid shape memory actuators 1102 there beneath to counteract any movements caused by an earthquake or sever winds.

High Density Shape Memory Actuator

Figure 12B:
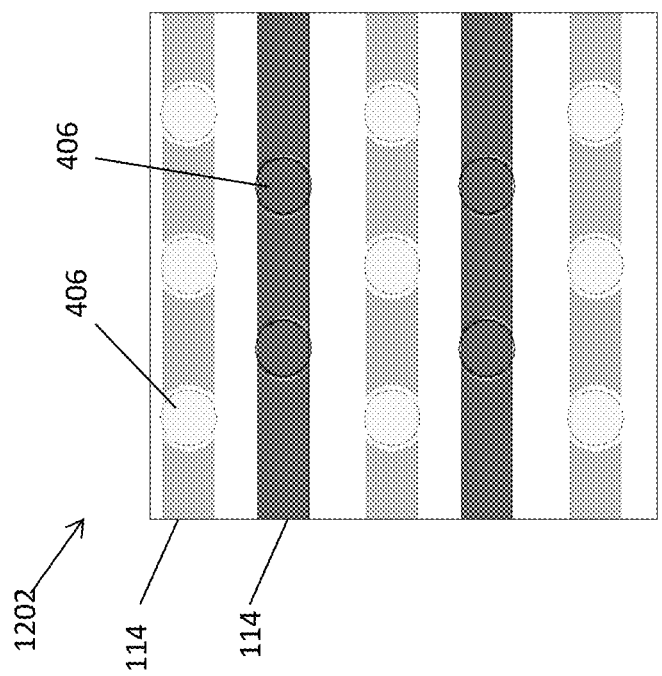
FIGS. 12A and 12B illustrate perspective views of a high density shape memory actuator having multiple insulation layers with conduction points formed there though in accordance with embodiments of the invention.
Figure 12A:
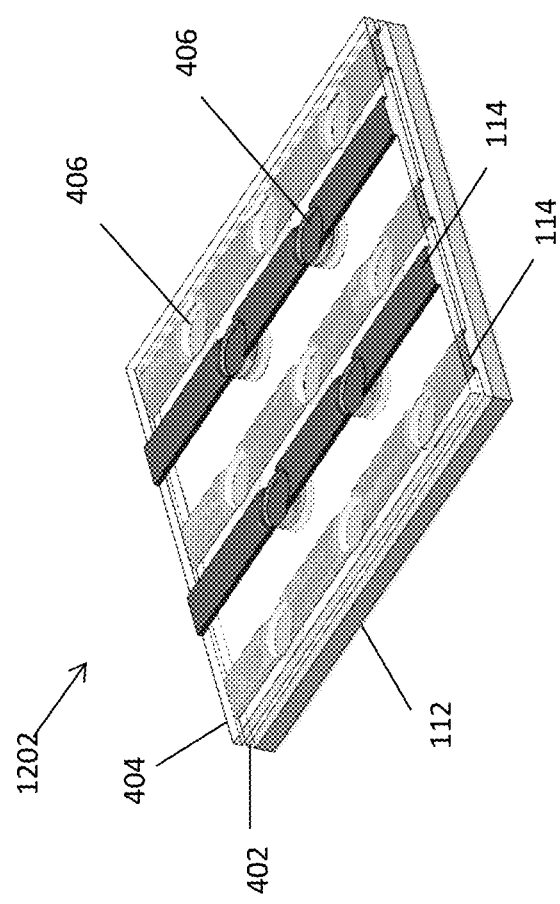

In a specific inventive embodiment, with reference to FIGS. 12A and 12B, a high density shape memory actuator 1202 is shown. FIG. 12A is a perspective view of the high density shape memory actuator 1202 and FIG. 12B is a top plan view thereof. The high density shape memory actuator 1202 includes a first insulation layer 402 with individual conductors 114 interfaced thereon and a second insulation layer 404 with individual conductors 114 interfaced thereon. Conduction points 406 are formed by removing the insulation at specific regions where the conductors 114 are routed through the removed insulation to interface directly with the body 112. The SMM may be heated at the specific regions using the same methods as described above. The advantage of the insulating layers 402/404 is the number of conduction points 406 may be greatly increased on the body 112 and an individual conductor does not have to traverse the entire length/width of the body 112. It should be appreciated that multiple insulation layers may be stacked to further improve the density of conduction points 406 interfacing with a surface of the body 112.

Design and Optimization of Shape Memory Actuators

In specific inventive embodiments, with reference to FIG. 13, a method for designing a shape memory actuator is shown generally as a schematic at 1300. The method may be performed on a computer with shape memory actuator planning software, which allows a user to create virtual models of the shape memory actuator(s) prior to manufacturing the shape memory actuator(s). The planning software includes various modules that allow the user to perform the method. The method generally includes the steps of creating/defining a desired geometry of a shape memory material (Block 1302). The desired geometry may include the dimensions or shape of the material such as the length, width, height or thickness. Once the desired shape is defined, at least one material property for at least a portion of the body may be defined or specified (Block 1304). The material property may include for example, the type of SMM, the thermal permittivity, thermal conductivity, active cooling rate, passive cooling rate, strength, modulus, roughness, surface finish, surface coatings, and combinations thereof. At least one kinetic property may also be defined or specified for at least a portion of the body (Block 1306). The kinetic properties may include for example, the conductor array patterns, type of conductors, the location of conduction points, the number of insulating layers, the location of insulating holes or air gaps, one or more rigid segments where the SMM remains rigid, linkage locations for other shape memory actuators to be built upon, location of controllers, the pre-treated "memorized" state for at least a portion of the SMM, actuating degrees of freedom, actuating axes, actuation vectors, actuating contraction/expansion, degree of deflection, degree of stiffness, degree of elasticity, and combinations thereof.

The user specified geometries, material properties, and/or kinetic properties may be chosen from a database of SMM, which may contain a variety of pre-loaded associated properties.

In addition, the shape memory actuator planning software may also permit the user to create multiple shape memory actuators, structures, or sub-structures for assembly. The actuators may be simulated in a simulation engine module in arbitrary combinations of regions based on the user defined geometries, material properties, and kinetic properties (Block 1306). The user may observe and measure their behaviors (Block 1308), and may dynamically adjust any of the user defined geometries, material properties and/or kinematic properties (Block 1310). The planning software may then estimate a life expectancy in terms of actuation cycles under user definable loads, ambient temperatures, or other conditions depending on the application for the shape memory actuator(s). Finally, the user may adjust, re-define, or tune the kinematic mathematical models of the user defined shape memory actuator(s), as well as define any new kinematic or material properties (Block 1312). Once the user is satisfied with the kinematics and behavior of the virtually defined shape memory actuator model(s), the model(s) may be sent for fabrication/manufacturing of a physical shape memory actuator(s).

Fabrication

The controllable shape memory actuators may be manufactured/fabricated using methods known in the art. For example, the conductors may be attached to the SMM using adhesives, welding, soldering, brazing, vapor deposition, or using other fasteners.

Figure 14:
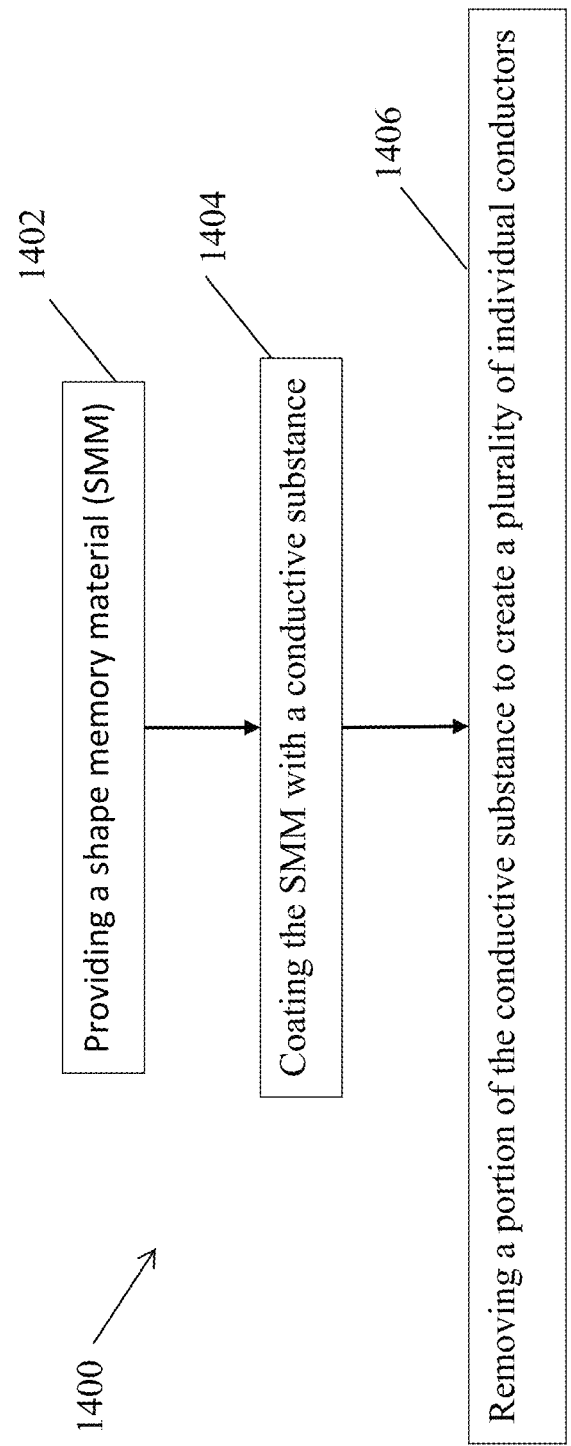
FIG. 14 is a flowchart of an illustrative method for fabricating a controllable shape memory actuator in accordance with embodiments of the invention.

In particular inventive embodiments, with reference to FIG. 14, a method for fabricating a shape memory actuator is shown at 1400. The method generally includes providing a shape memory material (Block 1402). The SMM may have the geometry and properties as defined or specified by the user using method 1300. The SMM is then coated with a conductive substance (Block 1404). The conductive substance is preferably graphene due to its conductive properties, ability to create individual conductors on the nanometer scale, and for its ability to maintain an electrical connection when the conductors are bent during actuation. The coating may be applied by dipping, spraying, painting, or vapor depositing the conductive substance on the SMM. Finally, a portion of the conductive substance is removed so a plurality of individual conductors remain thereon (Block 1406). The method of removal may be by chemical treatment, laser removal, or mechanical removal. In specific embodiments, the conductive substance may initially be a non-conductive material, such as graphene oxide, where the removal step includes chemically treating the graphene oxide to graphene. This creates individual conductors made of graphene, with non-conductive graphene oxide there between. This may be advantageous in insulating the areas between undesirable connections, or when cycling through various conduction points to minimize heat dissipation to unwanted areas.

In specific inventive embodiments, the size, shape, and geometry of a shape memory actuator may be fabricated using three-dimensional (3D) printing and/or CAD/CAM techniques. It should be appreciated that SMM may be provided to a consumer in particulate form that may be used to fabricate the SMM using a 3D printing technique such as laser sintering. A user may design a specific structure for the solid shape memory actuator in a CAD program or the planning software described above and subsequently 3D print the structure. The 3D printer may also print the conductors 114/115 in the desired locations as specified by the user. These techniques may be extremely valuable when fabricating a solid shape memory actuator, like the example of the solid shape memory actuator 1102 shown in FIG. 11.

Other Embodiments

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the described embodiments in any way. Rather, the foregoing detailed description will provide those skilled in the art with a convenient roadmap for implementing the exemplary embodiment or exemplary embodiments. It should be understood that various changes may be made in the function and arrangement of elements without departing from the scope as set forth in the appended claims and the legal equivalents thereof.

The invention claimed is:

1. A shape memory actuator system, comprising:
   a shape memory actuator having a body made of a shape memory material, with a plurality of individual power conductors interfaced with a first surface of the body, and a plurality of individual ground conductors interfaced with an opposing surface of the body to create an array of individual conduction volumes on the body, the conduction volumes characterized by an intersection of a portion of one or more of the plurality of individual power conductors located on the first surface and a portion of one or more of the plurality of individual ground conductors located on the opposing surface;
   a power source for providing power to the plurality of individual power conductors; and
   a controller for controlling a resistive heating current connection sufficient to impart shape memory to the body at one or more conduction points created between the plurality of individual power conductors and the plurality of individual ground conductors with the proviso that the plurality of individual ground conductors are physically separated from the plurality of individual power conductors by at least a thickness of the body.

2. The shape memory actuator system of claim 1 further comprising a plurality of shape memory actuators arranged around a tubular ring.

3. A shape memory article comprising:
a body made of shape memory material, with a plurality of individual power conductors interfaced with a first surface of the body, and a plurality of individual ground conductors interfaced with an opposing surface of the body to create an array of individual conduction volumes on the body, the conduction volumes characterized by an intersection of a portion of one or more of the plurality of individual power conductors located on the first surface and a portion of one or more of the plurality of individual ground conductors located on the opposing surface; and
wherein one or more conduction volumes in the array of individual conduction volumes are preferentially heated to impart shape memory with the proviso that the plurality of individual ground conductors are physically separated from the plurality of individual power conductors by at least a thickness of the body.

4. The shape memory article of claim 3 further comprising at least one hole between a plurality of conduction volumes in the array of individual conduction volumes.

5. A method for controlling a shape memory actuator comprising:
providing a shape memory actuator having a body made of a shape memory material, with a plurality of individual power conductors interfaced with a first surface of the body, and a plurality of individual ground conductors interfaced with an opposing surface of the body to create an array of individual conduction volumes on the body, the conduction volumes characterized by an intersection of a portion of one or more of the plurality of individual power conductors located on the first surface and a portion of one or more of the plurality of individual ground conductors located on the opposing surface;
controlling a connection between one or more individual power conductors of the plurality of individual power conductors and one or more individual ground conductors of the plurality of ground conductors; and
providing power through the connection to resistively heat the body at one or more conduction volumes created between the one or more individual power conductors and the one or more individual ground conductors to impart a shape memory thereto.

6. The shape memory actuator system of claim 1 wherein the plurality of individual ground conductors are oriented non-parallel to the plurality of individual power conductors.

7. The shape memory actuator system of claim 6 wherein the plurality of individual ground conductors are oriented perpendicular to the orientation of the plurality of individual power conductors.

8. The shape memory actuator system of claim 3 wherein the plurality of individual ground conductors are oriented non-parallel to the plurality of individual power conductors.

9. The shape memory actuator system of claim 5 wherein the plurality of individual ground conductors are oriented non-parallel to the plurality of individual power conductors.

10. The shape memory actuator system of claim 1 wherein the plurality of individual power conductors are arranged in an array of annular shapes where a first individual power conductor interfaced near a center of the body has a smaller radius than a final individual power conductor interfaced near an outer edge of the body.

11. The shape memory actuator system of claim 10 wherein the plurality of individual ground conductors interface with the opposing surface in a radial array pattern about an axis that is orthogonal to the opposing surface of the body.

12. The shape memory actuator system of claim 3 wherein the plurality of individual power conductors are arranged in an array of annular shapes where a first individual power conductor interfaced near a center of the body has a smaller radius than a final individual power conductor interfaced near an outer edge of the body.

13. The shape memory actuator system of claim 5 wherein the plurality of individual power conductors are arranged in an array of annular shapes where a first individual power conductor interfaced near a center of the body has a smaller radius than a final individual power conductor interfaced near an outer edge of the body.

* * * * *

UNITED STATES PATENT AND TRADEMARK OFFICE
CERTIFICATE OF CORRECTION

PATENT NO. : 9,885,346 B2
APPLICATION NO. : 14/988266
DATED : February 6, 2018
INVENTOR(S) : Gibson Elliot Page 1 of 1

It is certified that error appears in the above-identified patent and that said Letters Patent is hereby corrected as shown below:

On the Title Page

Please delete:
"Assignee: Think Surgical, Inc., Fremont, CA (US)"

Signed and Sealed this
Twenty-fourth Day of July, 2018

Andrei Iancu
*Director of the United States Patent and Trademark Office*